(12) United States Patent
Do

(10) Patent No.: US 7,123,079 B2
(45) Date of Patent: Oct. 17, 2006

(54) HIGH VOLTAGE GENERATOR IN SEMICONDUCTOR MEMORY DEVICE

(75) Inventor: Chang-Ho Do, Kyoungki-do (KR)

(73) Assignee: Hynix Semiconductor, Inc.(KR)

( * ) Notice: Subject to any disclaimer, the term of this patent is extended or adjusted under 35 U.S.C. 154(b) by 112 days.

(21) Appl. No.: 11/030,748

(22) Filed: Dec. 22, 2004

(65) Prior Publication Data
US 2005/0206440 A1   Sep. 22, 2005

(30) Foreign Application Priority Data
Mar. 22, 2004  (KR)  ............. 10-2004-0019438

(51) Int. Cl.
G05F 1/575  (2006.01)
H02M 3/07  (2006.01)

(52) U.S. Cl. .............. 327/536; 363/59; 365/189.09

(58) Field of Classification Search ............ None
See application file for complete search history.

(56) References Cited

U.S. PATENT DOCUMENTS

| | | | |
|---|---|---|---|
| 5,535,160 A * | 7/1996 | Yamaguchi | 365/189.01 |
| 5,877,651 A | 3/1999 | Furutani | |
| 6,130,829 A * | 10/2000 | Shin | 363/60 |
| 6,304,469 B1 | 10/2001 | Liu | |
| 6,522,558 B1 | 2/2003 | Henry | |
| 6,812,776 B1 | 11/2004 | Henry | |
| 6,977,828 B1 * | 12/2005 | Wada | 363/60 |
| 7,042,774 B1 * | 5/2006 | Kim | 365/189.11 |

FOREIGN PATENT DOCUMENTS

| | | |
|---|---|---|
| JP | 8-79065 | 3/1996 |
| KR | 1020000026486 | 5/2000 |

* cited by examiner

Primary Examiner—Timothy P. Callahan
Assistant Examiner—Terry L. Englund
(74) Attorney, Agent, or Firm—Blakely Sokoloff Taylor & Zafman

(57) ABSTRACT

A high voltage generator includes a high voltage level detector for comparing a boosted high voltage with a reference voltage and generating an oscillator control signal being a first logic level in response to a comparison result; a clock feedback block for receiving the oscillator control signal and an inverse pumping control signal and keeping an oscillator enable signal in the first logic level for a predetermined period; an oscillator for generating a pumping control signal in response to the oscillator enable signal and outputting the inverse pumping control signal to the clock feedback block, wherein the pumping control signal is periodically toggled; and a charge pumping block for generating the boosted high voltage in response to the pumping control signal.

10 Claims, 4 Drawing Sheets

HIGH VOLTAGE GENERATOR IN SEMICONDUCTOR MEMORY DEVICE

FIELD OF INVENTION

The present invention relates to a voltage generator for boosting a supply voltage; and, more particularly, to a high voltage generator included in a semiconductor memory device for raising a supply voltage to a predetermined level.

DESCRIPTION OF PRIOR ART

Recently, a supply voltage used in a semiconductor memory device becomes lower, but an operating speed of the semiconductor memory device becomes much faster. Thus, the semiconductor memory device boosts a supply voltage to a predetermined level for guaranteeing a stable operation and improves a speed for sensing a data in a unit cell.

For example, in case of a dynamic random access memory (DRAM) of which unit cell is constituted with one capacitor and a transistor, the transistor in the unit cell is usually a NMOS transistor instead of a PMOS transistor because a size of the PMOS transistor is higher than that of the NMOS transistor. However, the NMOS transistor can fast transmit a logic low level data, i.e., '0'; but, in case of a logic high level data, i.e., '1', an operating speed of the NMOS transistor is relatively slow because of a threshold voltage Vth. Therefore, for improving the operating speed of the NMOS transistor and reading/writing the logic high level data of which level is generally similar to a supply voltage (VDD) level into a unit cell without a loss as much as a threshold voltage (Vth) level, a high voltage VPP of which level is more the threshold voltage level than the supply voltage level is requested.

The semiconductor memory device usually raises the supply voltage VDD to a predetermined level because a level of the high voltage VPP should be kept more than the supply voltage level.

FIG. 1 is a block diagram showing a conventional high voltage generator used in a conventional semiconductor memory device.

As shown, the conventional high voltage generator includes a high voltage level detector 110, a ring oscillator 120 and a charge pump 130.

In detail, the voltage level detector 110 compares a high voltage VPP, which is outputted and fedback from the charge pump 130, with a reference voltage Vref; and, then, outputs an oscillator enable signal OSCEN having a logic high level "H" to the ring oscillator 120 if a level of the high voltage VPP does not reach on a predetermined voltage level. The ring oscillator 120 receives the oscillator enable signal OSCEN and generates a pumping clock signal OSC in response to the oscillator enable signal OSCEN. If the pumping clock signal OSC is a logic low level "L", the charge pump 130 precharges a first capacitor C1. Then, if the pumping clock signal OSC is a logic high level "H", the charge pump 130 generates the high voltage VPP by using the first capacitor C1.

Herein, the ring oscillator 120 includes a delay block constituted with a plurality of inverters. For example, the delay block can have six inverters.

FIG. 2 is a timing diagram describing an operation of the conventional high voltage generator shown in FIG. 1. Further, an operation of the conventional high voltage generator shown in FIG. 1 is described.

If the oscillator enable signal OSCEN is inputted to the ring oscillator 120, the ring oscillator 120 generates the pumping clock signal OSC. Herein, a period of the pumping clock signal OSC is determined by the delay block. If the pumping clock signal OSC becomes a logic high level "H", a voltage level of a first node node1 which is initially precharged as a supply voltage (VDD) level is boosted up by a precharged first capacitor C1. Then, a boost-up voltage of the first node node1 is transmitted through a first NMOS transistor N1 turned on by a control signal OSC_H. After a predetermined time, if the pumping clock signal OSC becomes a logic low level, first and second PMOS transistors P1 and P2 are turned on and, then, the first capacitor C1 and a second capacitor C2 are precharged.

In the conventional high voltage generator, the ring oscillator 120 normally outputs the pumping clock signal OSC toggled according to a predetermined period. However, referring to FIG. 2, if the oscillator enable signal OSCEN is inactivated, i.e., becomes a logic low level, the last period of the pumping clock signal OSC is not guaranteed. That is, before the ring oscillator 120 is disabled, the charge pump 130 cannot boost up the high voltage VPP to a desired voltage level. Particularly, if there is not guaranteed the last logic high level period of the pumping clock signal OSC, the boost-up voltage of the first node node1 is not fully transmitted through the first NMOS transistor N1 but discharged. As a result, efficiency and duty of the charge pump 130 are decreased.

SUMMARY OF INVENTION

It is, therefore, an object of the present invention to provide a semiconductor memory device having a high voltage generator for increasing efficiency and duty of a charge pump by guaranteeing an activation period of the charge pump.

In accordance with an aspect of the present invention, there is provided a high voltage generator including a high voltage level detector for comparing a high voltage with a reference voltage and generating an oscillator control signal being a first logic level in response to a comparison result; a clock feedback block for receiving the oscillator control signal and an inverse pumping control signal and keeping an oscillator enable signal in the first logic level for a predetermined period; an oscillator for generating a pumping control signal in response to the oscillator enable signal and outputting the inverse pumping control signal to the clock feedback block, wherein the pumping control signal is periodically toggled; and a charge pumping block for boosting up the high voltage in response to the pumping control signal.

In accordance with another aspect of the present invention, there is provided a method for generating a high voltage including the steps of A) comparing the high voltage with a reference voltage and generating an oscillator control signal being a first logic level in response to a comparison result; B) generating an inverse pumping control signal and keeping an oscillator enable signal in the first logic level for a predetermined period; C) generating a pumping control signal in response to the oscillator enable signal and outputting the inverse pumping control signal to the clock feedback block, wherein the pumping control signal is periodically toggled; and D) boosting up the high voltage in response to the pumping control signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a high voltage generator included in a semiconductor memory device for increasing efficiency and duty of a charge pump according to the present invention will be described in detail referring to the accompanying drawings.

Figure 1:
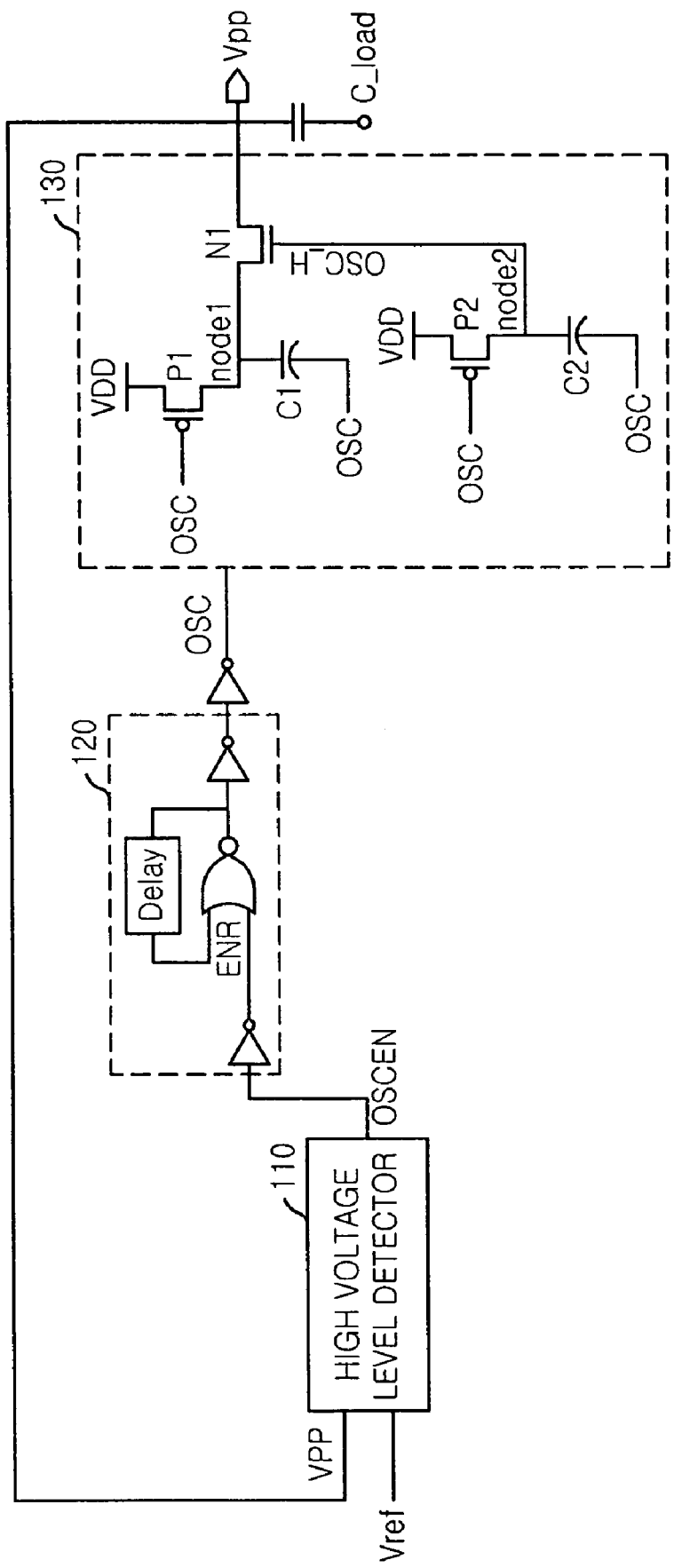
FIG. 1 is a block diagram showing a conventional high voltage generator used in a conventional semiconductor memory device.
Figure 2:
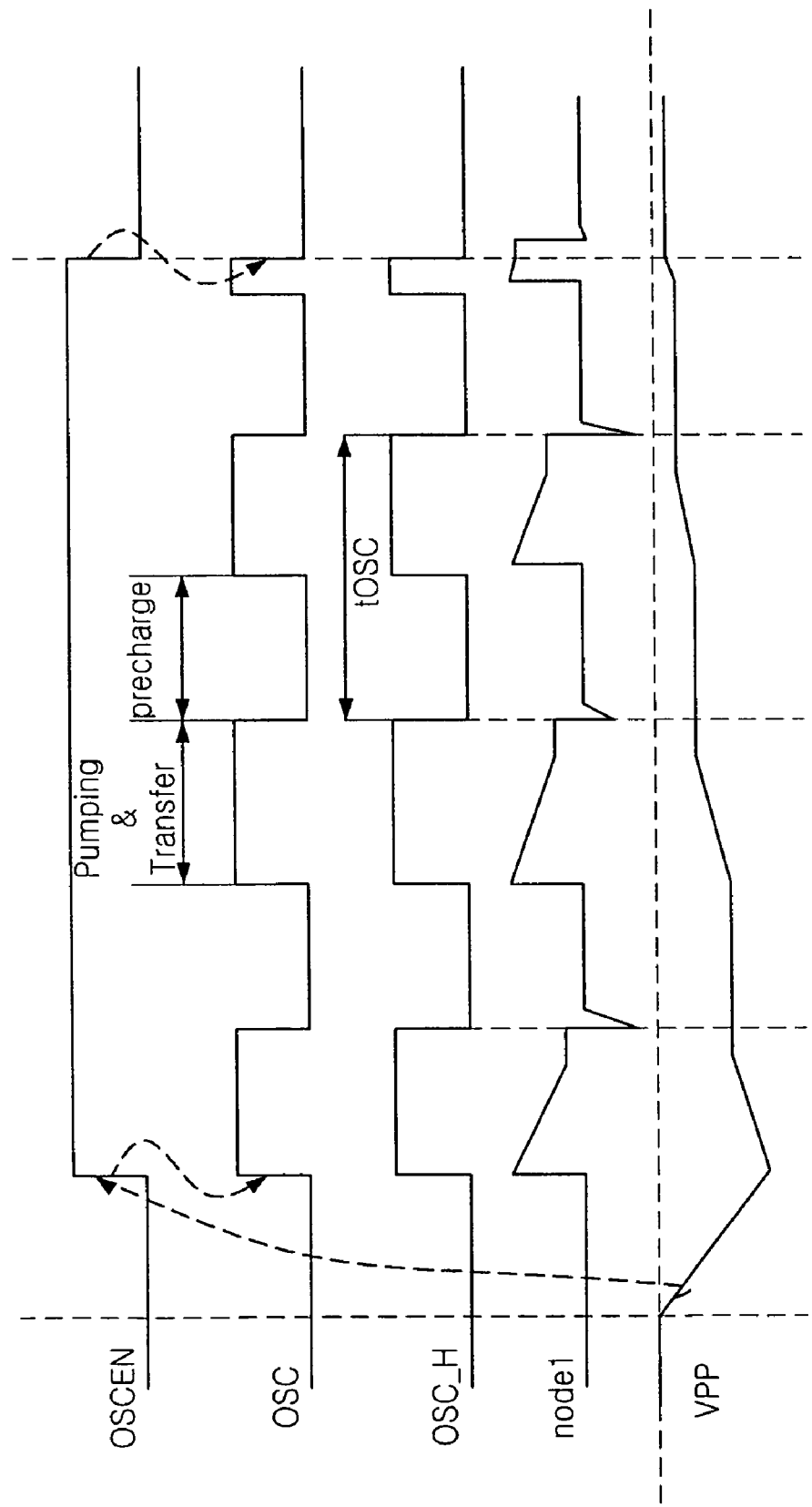
FIG. 2 is a timing diagram describing an operation of the conventional high voltage generator shown in FIG. 1.
Figure 3:
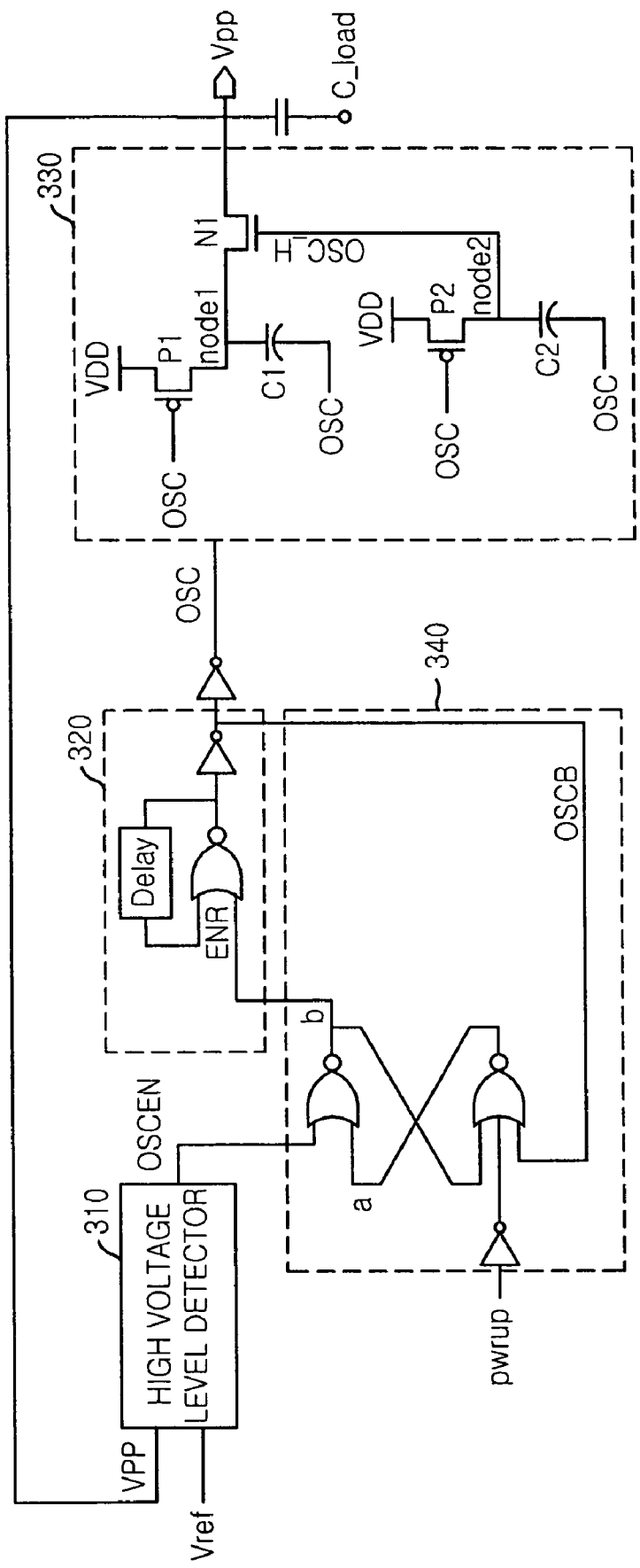
FIG. 3 is a block diagram showing a high voltage generator in a semiconductor memory device in accordance with the present invention.

FIG. 3 is a block diagram showing a high voltage generator in a semiconductor memory device in accordance with the present invention.

As shown, the high voltage generator includes a high voltage level detector 310, an oscillator 320, a clock feedback block 340 and a charge pumping block 330.

The high voltage level detector 310 compares a high voltage VPP with a reference voltage Vref and generates an oscillator control signal OSCEN in response to a comparison result. Herein, the oscillator control signal OSCEN becomes a logic high level "H" if the high voltage VPP is under a predetermined level. That is, the oscillator control signal OSCEN outputted from the high voltage level detector 310 becomes a logic low level if the high voltage VPP is higher than a predetermined level of the reference voltage Vref.

The clock feedback block 340 receives the oscillator control signal OSCEN to thereby output an oscillator enable signal ENR to the oscillator 320. In response to the oscillator enable signal ENR, the oscillator 320 generates a pumping control signal OSC. Also, the oscillator 320 outputs an inverse pumping control signal to the clock feedback block 340. Herein, the pumping control signal OSC is periodically toggled. The charge pumping block 330 is for boosting up the high voltage in response to the pumping control signal. If the pumping control signal OSC is a logic low level "L", the charge pumping block 330 precharges a first capacitor C1. Then, if the pumping control signal OSC is a logic high level "H", the charge pumping block 330 generates the high voltage VPP by using the first capacitor C1. Further, the oscillator 320 includes a delay block constituted with a plurality of inverters. For example, the delay block can have six inverters. Also, the delay block determines a period of the pumping control signal OSC.

The charge pumping block 330 is the same as a charge pump 130 included in a conventional high voltage generator in their structures. Thus, a detailed description about an internal structure of the charge pumping block 330 is omitted herein.

Further, the clock feedback block 340 includes two NOR gates, each cross-coupled to each other. A first NOR gate receives the oscillator control signal OSCEN and an output signal 'a' from a second NOR gate. The second NOR gate receives an output signal 'b' from the first NOR gate, an inverse power-up signal pwrup and the inverse pumping control signal OSCB. The clock feedback block 340 further includes a first inverter for inverting the power-up signal pwrup to the second NOR gate.

The oscillator 320 includes a first NOR gate, a delay block, a second inverter and a third inverter. The first NOR gate is for receiving the oscillator enable signal to thereby generate a pulse. The delay block receives an output signal of the first NOR gate in order to feedback the output signal to the first NOR gate. The first inverter receives the pulse outputted from the first NOR gate to thereby generate the inverse pumping control signal to the clock feedback block 340. The second inverter is for receiving the inverse pumping control signal and outputting the pumping control signal to the charge pumping block.

Figure 4:
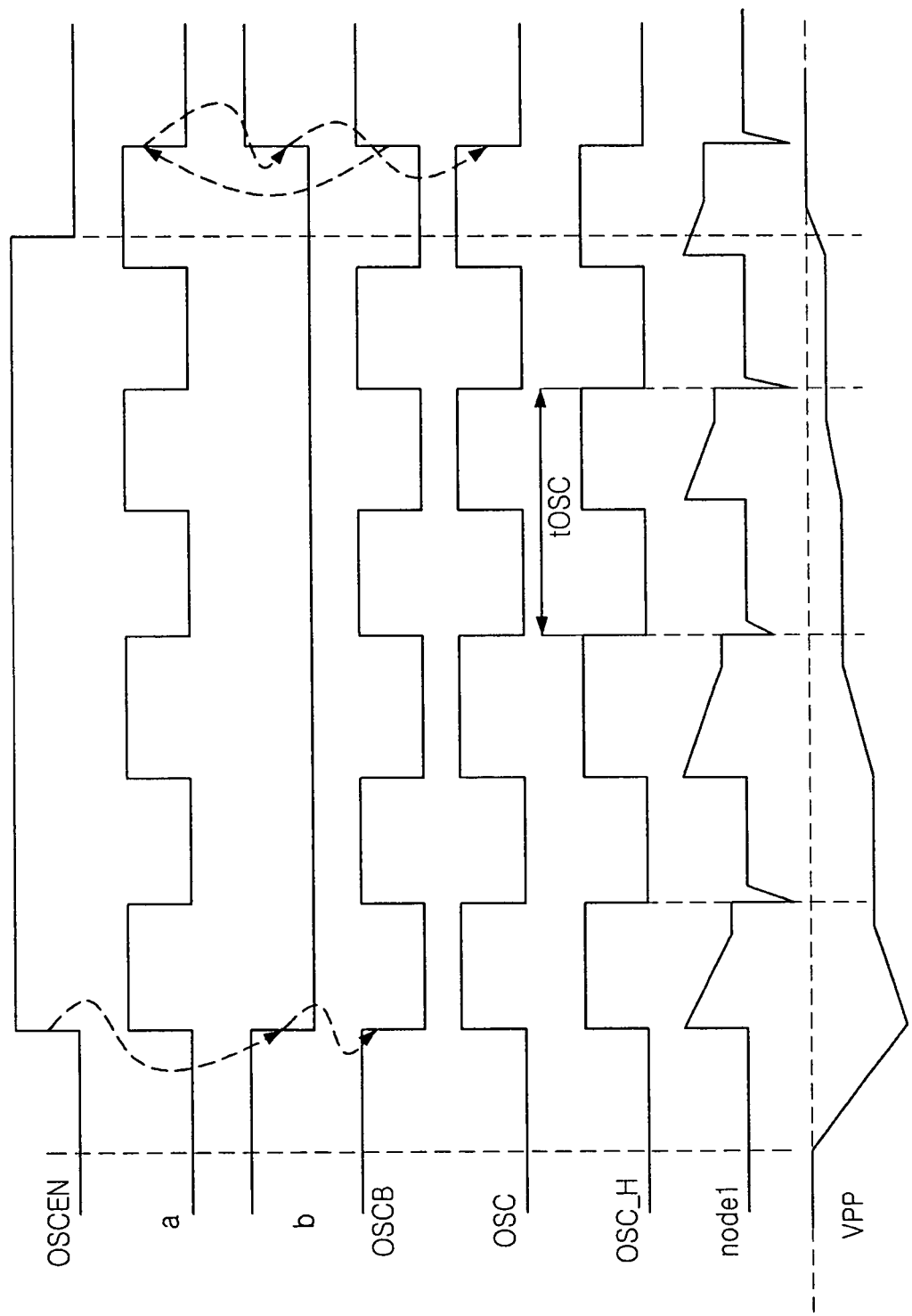
FIG. 4 is a timing diagram describing an operation of the high voltage generator shown in FIG. 3.

FIG. 4 is a timing diagram describing an operation of the high voltage generator shown in FIG. 3. Furthermore, an operation of the high voltage generator shown in FIG. 3 is described.

If the oscillator enable signal ENR is inputted to the oscillator 320, the oscillator 320 generates the pumping control signal OSC. If the pumping control signal OSC becomes a logic high level "H", a voltage level of a first node node1 which is initially precharged as a supply voltage (VDD) level is boosted up by a precharged first capacitor C1. Then, a boost-up voltage of the first node node1 is transmitted through a first NMOS transistor N1 turned on by a control signal OSC_H. At this time, a level of the boost-up high voltage VPP is higher than that of a supply voltage VDD. After a predetermined time, if the pumping control signal OSC becomes a logic low level, first and second PMOS transistors P1 and P2 are turned on and, then, the first capacitor C1 and a second capacitor C2 is precharged.

In the high voltage generator in accordance with the present invention, the oscillator 320 normally outputs the pumping control signal OSC having a predetermined period after the oscillator control signal OSCEN is inactivated. Referring to FIG. 4, if the oscillator control signal OSCEN becomes a logic low level, the last period of the pumping control signal OSC is guaranteed because the oscillator enable signal ENR, i.e., the output signal 'b' of the first NOR gate included in the clock feedback block 340, is kept in a logic low level during a predetermined time.

In conclusion, the charge pumping block 330 is not directly disabled by the clock feedback block 340 though the high voltage level detector 310 outputs the oscillator control signal OSCEN being a logic level low. That is, the last enable period of the pumping control signal OSC is guaranteed during a half of one period of the pumping control signal OSC. Therefore, before the oscillator 320 is disabled, the charge pumping block 330 can sufficiently boost up the high voltage VPP to a desired voltage level.

According to the present invention, power unnecessarily consumed for generating a high voltage can be suppressed fully. In addition, in a semiconductor memory device receiving a low level supply voltage, an internal high voltage of which level is higher than that of the low level supply voltage can be stably generated. Particularly, the present invention is very useful in a semiconductor device used for a system requiring a low power consumption such as a mobile system.

The present application contains subject matter related to Korean patent application No. 2004-19438, filed in the Korean Patent Office on Mar. 22, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A high voltage generator, comprising:
   a high voltage level detector for comparing a boosted high voltage with a reference voltage and generating an oscillator control signal in response to a comparison result;
   a clock feedback block for receiving the oscillator control signal and an inverse pumping control signal and keeping an oscillator enable signal in a first logic level for a predetermined period;
   an oscillator for generating a pumping control signal in response to the oscillator enable signal and outputting the inverse pumping control signal to the clock feedback block, wherein the pumping control signal is periodically toggled; and
   a charge pumping block for generating the boosted high voltage in response to the pumping control signal.

2. The high voltage generator as recited in claim 1, wherein the boosted high voltage is higher than a supply voltage.

3. The high voltage generator as recited in claim 2, wherein the oscillator control signal outputted from the high voltage level detector becomes a second logic level if the boosted high voltage is higher than a predetermined level of the reference voltage, wherein the second logic level is logically opposite to the first logic level.

4. The high voltage generator as recited in claim 3, wherein the predetermined period is a half of one period of the pumping control signal.

5. The high voltage generator as recited in claim 4, wherein the clock feedback block includes:
   a first NOR gate for receiving the oscillator control signal and outputting the oscillator enable signal; and
   a second NOR gate, cross-coupled with the first NOR gate, for outputting a pulse to the first NOR gate in response to the oscillator enable signal, a power-up signal and the inverse pumping control signal.

6. The high voltage generator as recited in claim 5, wherein the clock feedback block further includes a first inverter for inverting the power-up signal.

7. The high voltage generator as recited in claim 4, wherein the oscillator includes:
   a first NOR gate for receiving the oscillator enable signal to thereby generate a pulse;
   a delay block for receiving an output signal of the first NOR gate in order to feedback the output signal to the first NOR gate;
   a first inverter for receiving the pulse outputted from the first NOR gate to thereby generate the inverse pumping control signal; and
   a second inverter for receiving the inverse pumping control signal and outputting the pumping control signal to the charge pumping block.

8. The high voltage generator as recited in claim 7, wherein the delay block is constituted with a plurality of inverters.

9. A method for generating a boosted high voltage, comprising the steps of:
   A) comparing the boosted high voltage with a reference voltage and generating an oscillator control signal in response to a comparison result;
   B) generating an inverse pumping control signal and keeping an oscillator enable signal from a clock feedback block in a first logic level for a predetermined period;
   C) generating a pumping control signal in response to the oscillator enable signal and outputting the inverse pumping control signal to the clock feedback block, wherein the pumping control signal is periodically toggled; and
   D) generating the boosted high voltage in response to the pumping control signal.

10. The method as recited in claim 9, wherein a the boosted high voltage is higher than a supply voltage.

* * * * *

UNITED STATES PATENT AND TRADEMARK OFFICE
CERTIFICATE OF CORRECTION

| | | |
|---|---|---|
| PATENT NO. | : 7,123,079 B2 | Page 1 of 1 |
| APPLICATION NO. | : 11/030748 | |
| DATED | : October 17, 2006 | |
| INVENTOR(S) | : Do | |

It is certified that error appears in the above-identified patent and that said Letters Patent is hereby corrected as shown below:

In claim #10, column 6, line 36, please delete "a".

Signed and Sealed this

Seventh Day of August, 2007

JON W. DUDAS
*Director of the United States Patent and Trademark Office*